US006876046B2

(12) United States Patent
Prophet

(10) Patent No.: US 6,876,046 B2
(45) Date of Patent: Apr. 5, 2005

(54) STICTION ALLEVIATION USING PASSIVATION LAYER PATTERNING

(75) Inventor: Eric M. Prophet, Santa Barbara, CA (US)

(73) Assignee: Superconductor Technologies, Inc., Santa Barbara, CA (US)

( * ) Notice: Subject to any disclaimer, the term of this patent is extended or adjusted under 35 U.S.C. 154(b) by 0 days.

(21) Appl. No.: 10/072,656

(22) Filed: Feb. 7, 2002

(65) Prior Publication Data

US 2003/0146464 A1 Aug. 7, 2003

(51) Int. Cl.$^7$ .......................... H01L 29/82; H01L 21/00
(52) U.S. Cl. ........................................ 257/415; 438/50
(58) Field of Search .............................. 257/306, 418, 257/415, 419, 416, 420, 417; 438/50, 244, 51, 253, 52, 387, 53, 396; 216/27; 347/54, 55

(56) References Cited

U.S. PATENT DOCUMENTS

| | | |
|---|---|---|
| 3,802,523 A | 4/1974 | Clark |
| 5,079,657 A | 1/1992 | Aronoff et al. |
| 5,307,593 A | 5/1994 | Lucker et al. |
| 5,482,564 A | 1/1996 | Douglas et al. |
| 5,506,017 A | 4/1996 | Ranjan et al. |
| 5,512,374 A | 4/1996 | Wallace et al. |
| 5,542,295 A | 8/1996 | Howe et al. |
| 5,599,590 A | 2/1997 | Hayashi et al. |
| 5,658,636 A | 8/1997 | Reed et al. |
| 5,662,771 A | 9/1997 | Stouppe |
| 5,700,379 A | 12/1997 | Biebl |
| 5,727,445 A | 3/1998 | Sheldon |
| 5,912,791 A | 6/1999 | Sundaram et al. |
| 5,942,279 A | 8/1999 | Wudu |
| 6,036,786 A | 3/2000 | Becker et al. |
| 6,127,744 A | 10/2000 | Streeter et al. |
| 6,127,765 A | 10/2000 | Fushinobu |
| 6,187,413 B1 | 2/2001 | Kuo et al. |
| 6,241,906 B1 * | 6/2001 | Silverbrook .................. 216/27 |
| 6,635,506 B2 * | 10/2003 | Volant et al. .................. 438/52 |

FOREIGN PATENT DOCUMENTS

JP          10196112          1/2000

OTHER PUBLICATIONS

Partial English translation of Japanese patent application No. 2000-31397.*

Niels Tas, Tonny Sonnenberg, Henri Jansen, Rob Legtenberg, Miko Elwenspoek, *Stiction in Surface Micromachining*, 1996, pp. 385–397, IOP Publishing Ltd., United Kingdom.

Takeshi Abe, Michael L. Reed, *Control of Liquid Bridging Induced Stiction of Micromechanical Structures*, 1996, pp. 213–217, IOP Publishing Ltd., United Kingdom.

Abe, Takeshi et al., Control of Liquid Bridging Induced Stiction of Micromechanical Structures, J.Micromech. Microeng. 6 (1996) 213–217.

(Continued)

Primary Examiner—Steven Loke
(74) Attorney, Agent, or Firm—O'Melveny & Myers LLP

(57) ABSTRACT

The present invention alleviates stiction between a suspended beam or microstructure and an underlying substrate by providing a patterned passivation layer on the substrate underneath the beam. The passivation layer is patterned to provide a substrate surface that differs substantially from the bottom surface of the beam. The difference between these two surfaces reduces the potential contact area between the beam and the substrate when the beam is pulled down, thereby reducing adhesive forces between the beam and the substrate and reducing the likelihood of stiction. In one embodiment, the passivation layer is patterned to form a substrate surface comprising a plurality of protuberances. In another embodiment, the passivation layer is patterned to form a substrate surface having a mesh pattern.

18 Claims, 10 Drawing Sheets

OTHER PUBLICATIONS

Almanza–Workman, A.M., et al., Water Dispersible Silanes for Wettability Modification of Polysilicon for Stiction Reduction in Silicon Based Micro–Electromechanical Structures.

Ashurst, W.R. et al., Alkene Based Monolayer Films as Anti–Stiction Coatings for Polysilicon MEMS, Berkley Sensor and Actuator Center.

Ashurst, W.R. et al., Dichlorodimethylsilane as an Anti–Stiction Coating for MEMS, National Science Foundation Report.

Harsh, K.F., Dealing With MEMS Stiction and Other Sticking Problems (website printout).

Kim, B.H. et al., A New Organic Modifier for Anti–Stiction, Journal of Microelectromechanical Systems, vol. 10, No. 1, Mar. 2001, pp 33–40.

Kim, Chang–Jin et al., Comparative Evaluation of Drying Techniques for Surface–Micromachining, submitted to Sensors & Actuators.

Maboudian, R. et al., Self–Assembled Monolayers as Anti––Stiction Coatings for MEMS: Characteristics and Recent Developments.

Maboudian, R., Critical Review: Adhesion in Surface Micromechanical Structures, J. Vac. Sci. Technol. B 15(1), Jan/Feb 1997, pp 1–20.

Mastrangelo, C.H., Suppression of Stiction in MEMS.

Tas, N. et al., Side–Wall Spacers for Stiction Reduction in Surface Micromachined Mechanisms.

Tas, Niels et al., Stiction in Surface Micromaching, 1996, pp. 385–397, IOP Publishing Ltd., United Kingdom.

Yang, Lung–Jieh et al., Photo–Patternable Gelatin as Protection Layers in Surface Micromachinings.

Yao, Tze–Jung et al., BrF3 Dry Release Technology for Large Freestanding Parylene MEMS.

\* cited by examiner

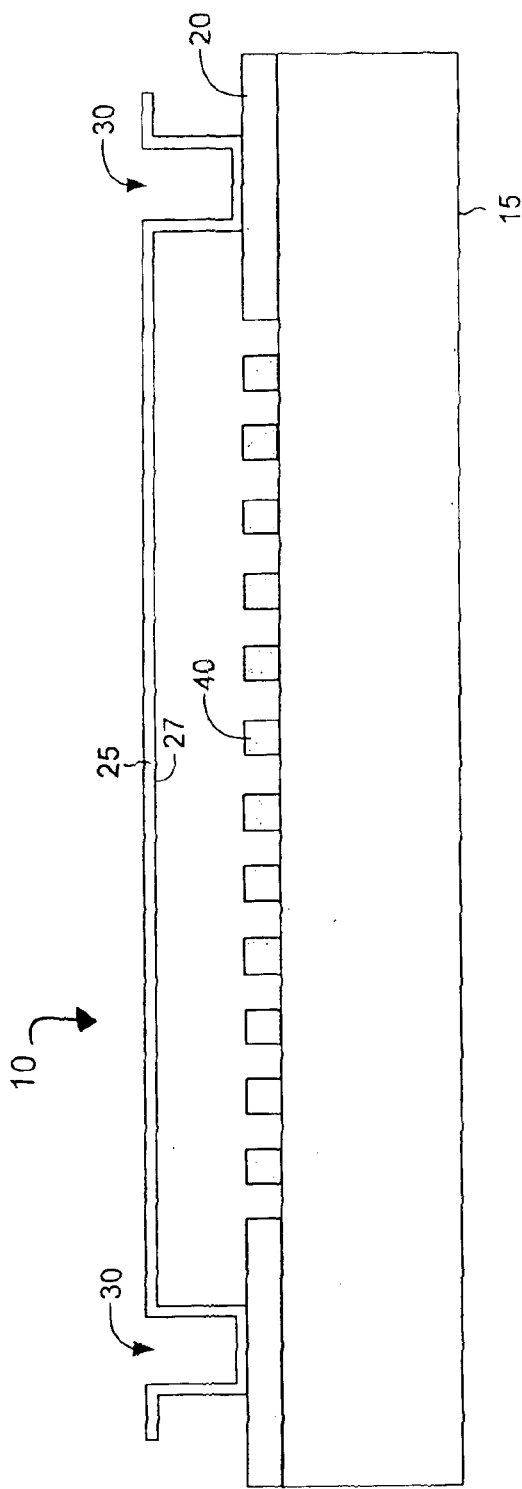
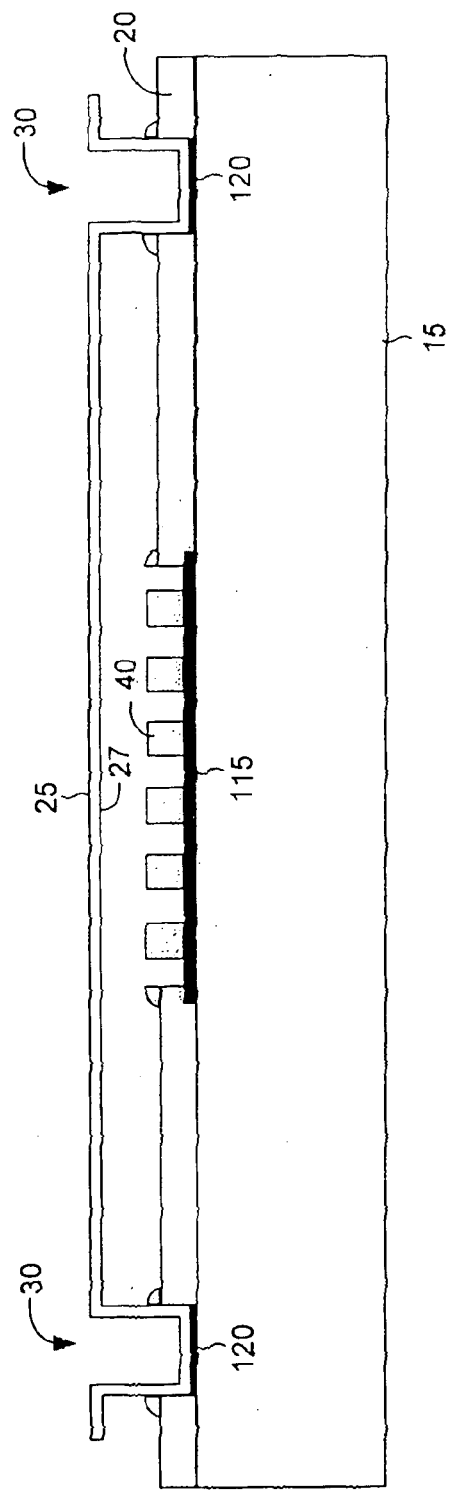

STICTION ALLEVIATION USING PASSIVATION LAYER PATTERNING

The U.S. Government has a paid-up license in this invention and the right in limited circumstances to require the patent owner to license others on reasonable terms as provided for by the terms of DARPA contract MDA972-00-C-0010.

TECHNICAL FIELD

The invention relates to stiction alleviation, and more particularly to stiction alleviation using a patterned passivation layer.

BACKGROUND OF THE INVENTION

Micro-Electro-Mechanical System (MEMS) devices find applications in a variety of fields, such as communications, sensing, optics, micro-fluidics, and measurements of material properties. In the field of communications, variable MEMS capacitors are used in tunable RF filter circuits. The MEMS capacitors offer several advantages over solid state varactor diodes, including a higher on/off capacitance ratio and a higher Quality (Q) factor. In addition, MEMS devices offer greater linearity compared to their solid state counterparts, which reduces intermodulation products when used in Radio Frequency (RF) applications.

Many of these MEMS devices comprise a beam or microstructure suspended above a substrate by one or more supports. In a variable MEMS capacitor, for example, the beam may be suspended above a bottom electrode on the substrate to form a capacitor with the beam acting as the top electrode. The capacitance of the variable MEMS capacitor is varied by establishing an electrostatic force between the beam and the bottom electrode. The electrostatic force bends the beam relative to the bottom electrode, thereby changing the gap between the beam and the bottom electrode and, therefore, the capacitance of the MEMS capacitor.

A problem in MEMS devices is permanent adhesion of the beam or microstructure to the underlying substrate. This phenomenon is commonly referred to as "stiction". Stiction typically occurs when a beam or other microstructure is brought into intimate contact with the substrate. Once in contact, adhesion forces, e.g., Van der Waals force and/or hydrogen bonding, on the surface of the substrate exceed the elastic restoring force of the beam. As a result, the beam remains stuck to the substrate, rendering the MEMS device unusable.

Stiction may occur during fabrication of a MEMS device. For example, stiction may occur when a sacrificial layer used to temporary support the beam during fabrication is removed to release the beam. The sacrificial layer is often removed using a wet enchant followed by a rinse with a liquid agent, e.g., deionized (DI) water and/or methanol. As the device dries, liquid agent trapped between the beam and the substrate may produce capillary forces sufficient to pull down the beam into intimate contact with the substrate. Stiction may also occur during operation of a MEMS device, sometimes referred to as "in-use" stiction. For example, stiction may occur in a MEMS capacitor when the electrostatic force used to vary the capacitance of the MEMS capacitor pulls down the beam into intimate contact with the substrate.

Several approaches have been developed to alleviate stiction. One approach is to provide a rough surface on the substrate underlying the beam to reduce adhesion forces between the beam and the substrate. This is commonly done by depositing a nitride layer onto the substrate and wet etching grain boundaries in the nitride layer to produce a rough surface. A drawback of this approach is that "pinholes" sometimes form in the nitride layer, which can lead to premature breakdown of the device. Another approach is to provide "dimples" or small bumps on the bottom surface of the beam to prevent the beam from coming into intimate contact with the substrate. A drawback of this approach is that it involves a cumbersome fabrication process that requires a planarization step, which may not be feasible in some process flows. Yet another approach is to use hydrophobic monolayers known as self assembled monolayers or SAM coatings to make the beam hydrophobic. This reduces the likelihood that water droplets will form under the beam and pull the beam down into intimate contact with the substrate.

SUMMARY OF THE INVENTION

The present invention alleviates stiction between a suspended beam or microstructure and an underlying substrate by providing a patterned passivation layer on the substrate underneath the beam. The passivation layer is patterned to provide a substrate surface that differs substantially from the bottom surface of the beam. The difference between these two surfaces reduces the potential contact area between the beam and the substrate when the beam is pulled down, thereby reducing adhesive forces between the beam and the substrate and the likelihood of stiction.

In one embodiment, a bottom electrode is provided on the substrate to form a variable MEMS capacitor with the suspended beam acting as the top electrode of the MEMS capacitor.

In another embodiment, the passivation layer is patterned to form a substrate surface comprising a plurality of protuberances.

In still another embodiment, the passivation layer is patterned to form a substrate surface having a mesh pattern.

In yet another embodiment, a bottom dielectric layer is provided between the patterned passivation layer and the substrate.

Other objects and features of the present invention will become apparent from consideration of the following description taken in conjunction with the accompanying drawings.

BRIEF DESCRIPTION OF THE DRAWINGS

FIG. 1 shows a MEMS structure comprising a patterned passivation layer for alleviating stiction according to an embodiment of the invention.

FIG. 2 shows a MEMS capacitor comprising a bottom electrode underneath the patterned passivation layer according to another embodiment of the invention.

DETAILED DESCRIPTION OF THE INVENTION

Figure 3A:
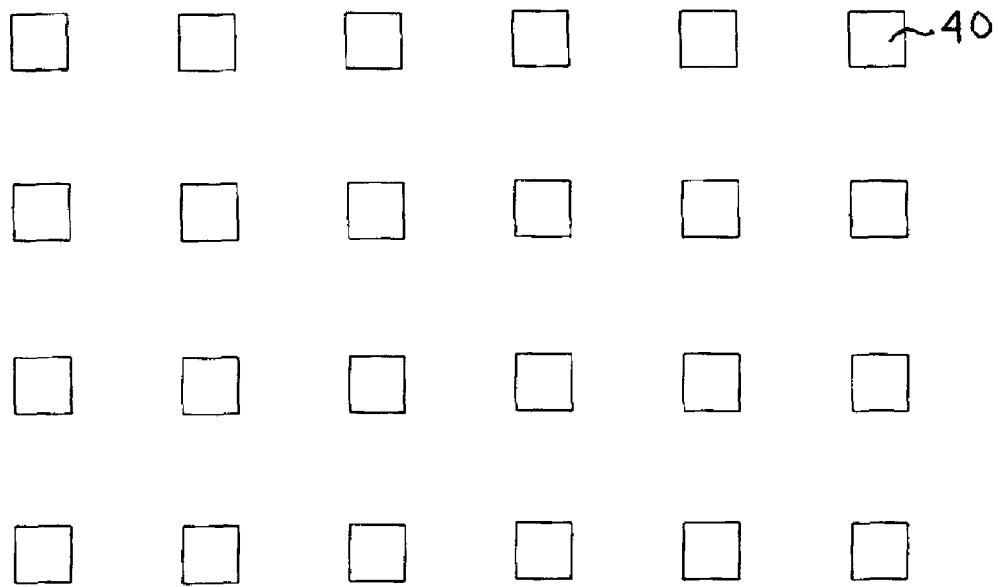
FIG. 3A is a top view of a passivation layer patterned into a plurality of square protuberances.

Referring to FIG. 1, a MEMS structure according to an embodiment of the invention is shown. The MEMS structure 10 comprises a substrate 15, a passivation layer 20 on the substrate 15, and a beam 25 suspended above the substrate 15. The substrate 15 may be made of silicon, MgO, Alumina, quartz, Gallium Arsinide (GaAs), or other suitable material. The passivation layer 20 may be made of a dielectric material, including, but not limited to, Silicon Nitride ($Si_3N_4$), Silicon Oxide ($SiO_2$), Strontium Titanate Oxide ($SrTiO_3$), polyimide, Barium Strontium Titanate (BST), and Benzocyclobutene (BCB). The beam 25 is suspended above the substrate 15 by two anchors 30 attached to each end of the beam 25. Alternatively, the beam 25 may be supported by a single anchor attached to one of its ends. The beam 25 may be made of a metal characterized by excellent flexibility, a high electrical conductivity and ease of deposition or may be made of other conductive material such as doped polysilicon. Suitable metals for the beam 25 include, but are not limited to, gold and silver. For RF applications, a low loss metal is preferred.

To alleviate stiction between the beam 25 and the substrate 15, the passivation layer 20 underlying the beam 25 is patterned to provide a substrate surface that differs from the bottom surface 27 of the beam 25. In the illustrative example in FIG. 1, the bottom surface 27 of the beam 25 is substantially flat, while the passivation layer 20 is patterned to form a substrate surface comprising a plurality of spaced protuberances 40. The difference between these two surfaces reduces the potential contact area between the beam 25 and the substrate 15 when the beam 25 is pulled down, thereby reducing adhesive forces between the beam 25 and substrate 15 and the likelihood of stiction.

Referring to FIG. 2, a variable MEMS capacitor according to an embodiment of the invention is shown. The MEMS capacitor is similar to the MEMS structure in FIG. 1, but further comprises a bottom electrode 115 on the substrate 15 and underneath the patterned passivation layer 20. The MEMS capacitor also comprises contact electrodes 120 on the substrate 20 and underneath at least one of the anchors 30. The electrodes 115, 120 may be made of metal, High Temperature Superconductor (HTS) material or other conductive material. In this embodiment, the suspended beam 25 acts as a top electrode of the MEMS capacitor. The gap and dielectric material (i.e, passivation layer 20) between the beam 25 and the underlying bottom electrode 115 determines the capacitance of the MEMS capacitor. The capacitance of the MEMS capacitor is varied by varying a bias voltage applied to the capacitor. The applied bias voltage establishes an electrostatic force on the beam 25 that bends the beam 25 relative to the bottom electrode 115, thereby varying the gap between the beam 25 and the bottom electrode 115. This in turn varies the capacitance of the MEMS capacitor. The passivation layer 20 overlying the bottom electrode 115 is patterned into a plurality of spaced protuberances 40 to alleviate stiction, e.g., "in use" stiction associated with electrostatic pull down of the beam 25.

Figure 3B:
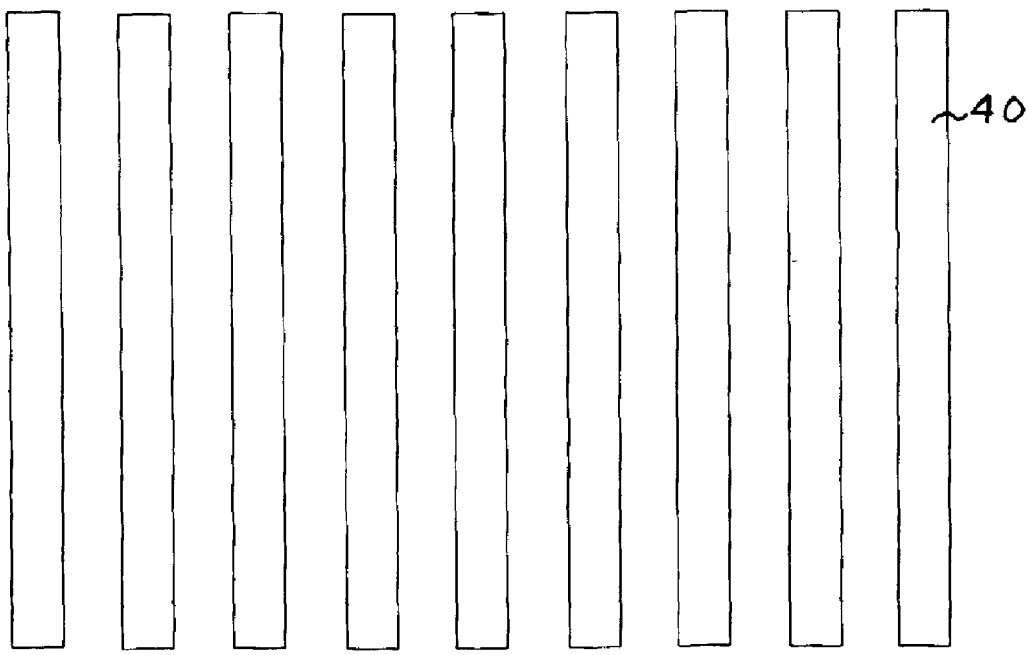
FIG. 3B is a top view of a passivation layer patterned into a plurality of rectangular protuberances.
Figure 3C:
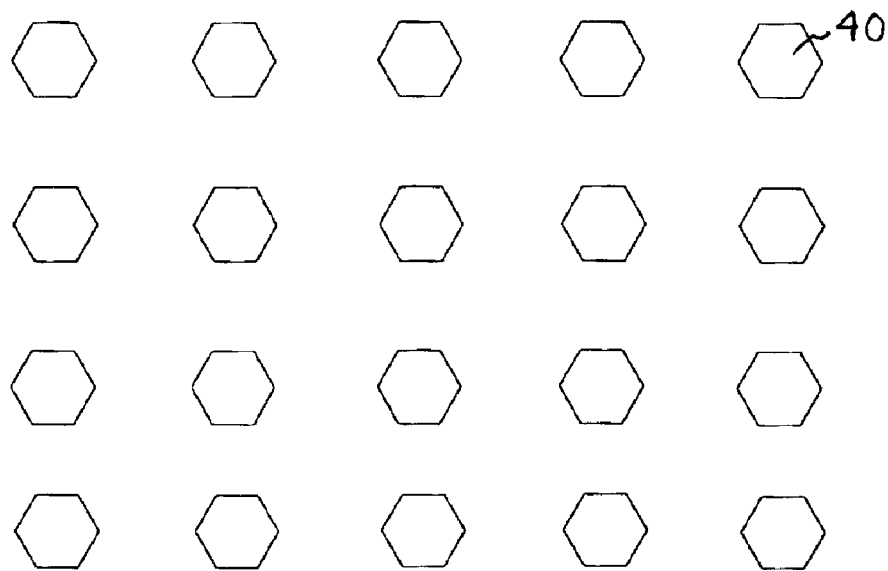
FIG. 3C is a top view of a passivation layer patterned into a plurality of hexagonal protuberances.
Figure 3D:
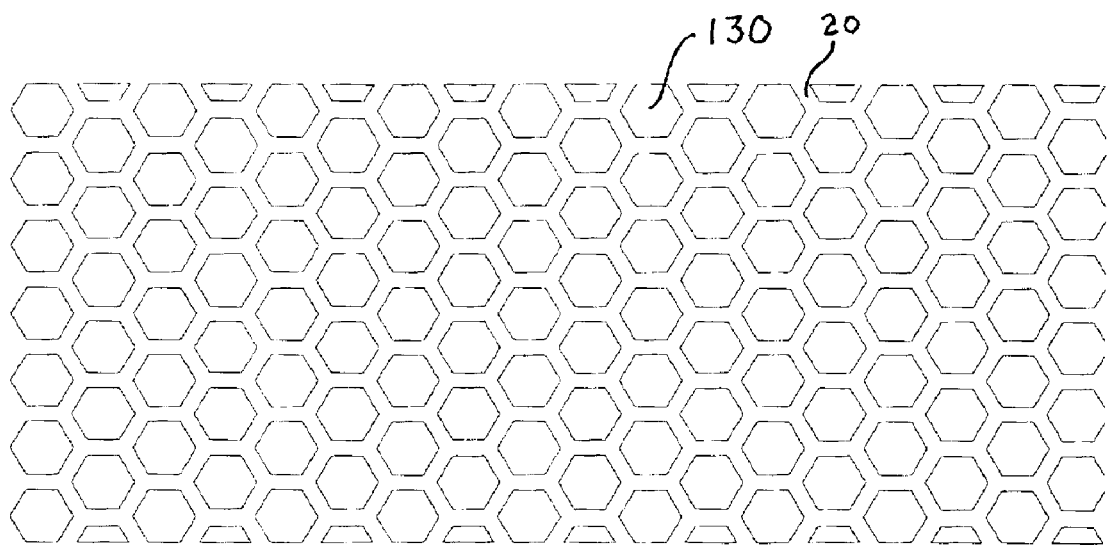
FIG. 3D is a top view of a passivation layer patterned into a hexagonal mesh.
Figure 3E:
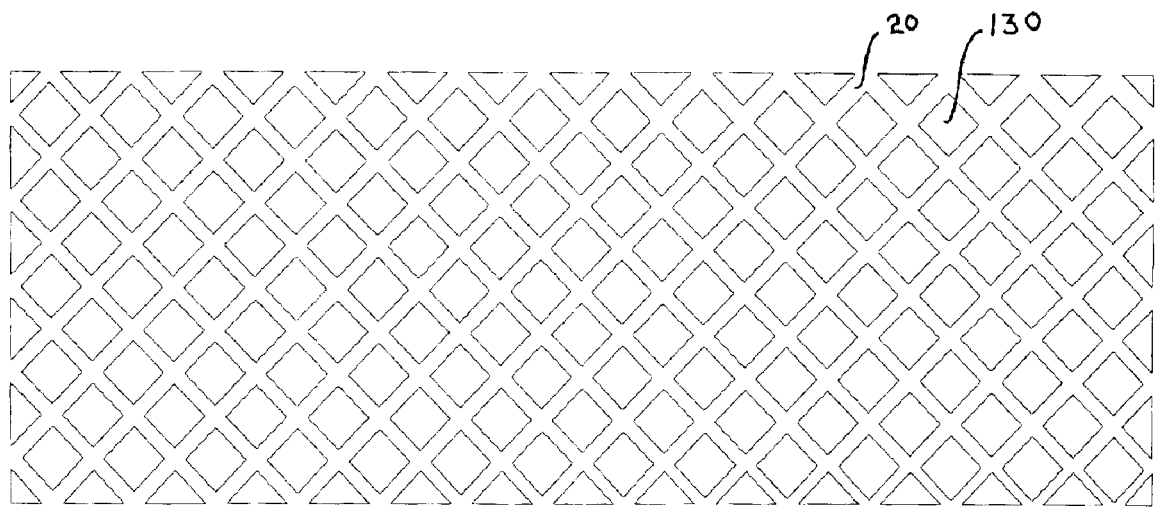
FIG. 3E is a top view of a passivation layer patterned into a square mesh.
Figure 3F:
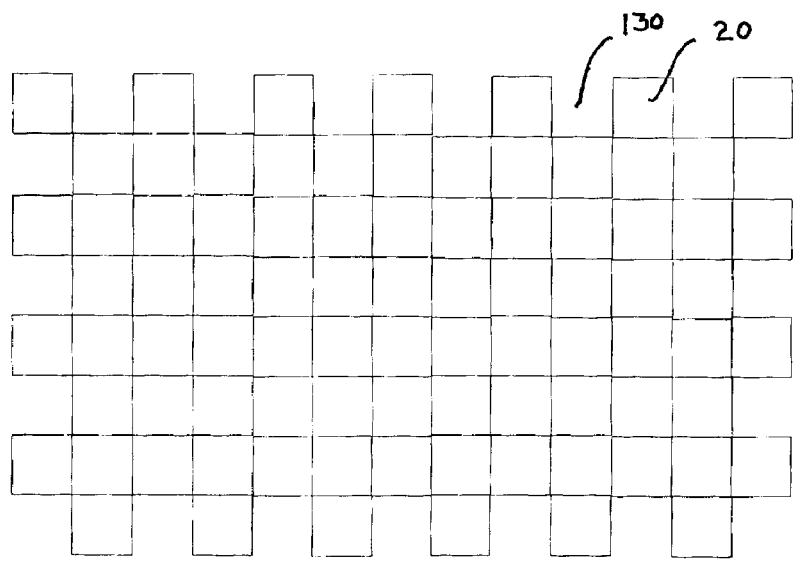
FIG. 3F is a top view of a passivation layer patterned into a checkerboard mesh.

Referring to FIGS. 3A–3F, the top view of patterned passivation layers 20 according to several embodiments of the invention are shown. In each of these embodiments, the passivation layer 20 is patterned to provide a substrate surface that differs from the flat bottom surface 27 of the beam 25 to alleviate stiction. FIGS. 3A–3C show the passivation layer 20 patterned into a plurality of protuberances 40 having square, rectangular, and hexagonal cross sections, respectively. Spacing the protuberances 40 far apart reduces the potential contact area between the substrate 15 and the beam 25 and, therefore, reduces the likelihood of stiction. In addition, spacing the protuberances 40 far apart reduces the fill-factor of the passivation layer 20, which reduces the lossiness of the passivation layer 20 when used, e.g., in a MEMS capacitor for high frequency applications. Spacing the protuberances too far apart, however, may allow portions of the beam 25 to bend down between adjacent protuberances 40 and make contact with the underlying substrate 15. FIGS. 3D–3F show the passivation layer patterned into a hexagonal mesh, a square mesh, and a checkerboard mesh, respectively. Each of these mesh patterns may be formed by selectively etching voids 130 into the passivation layer 20. For example, the checkerboard mesh in FIG. 3F may formed by etching square voids 130 into the passivation layer 20 in a checkerboard pattern. The patterns shown in FIGS. 3A–3F are for illustrative purposes and are not intended to be exhaustive.

Figure 4A:
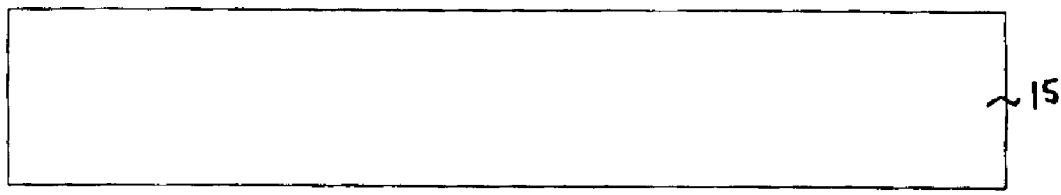
FIGS. 4A–4K show a process flow for fabricating the MEMS structure of FIG. 1 according to an embodiment of the invention.
Figure 4B:
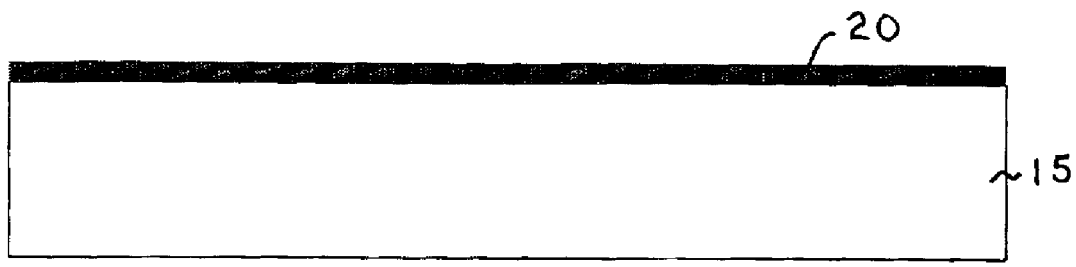
Figure 4C:
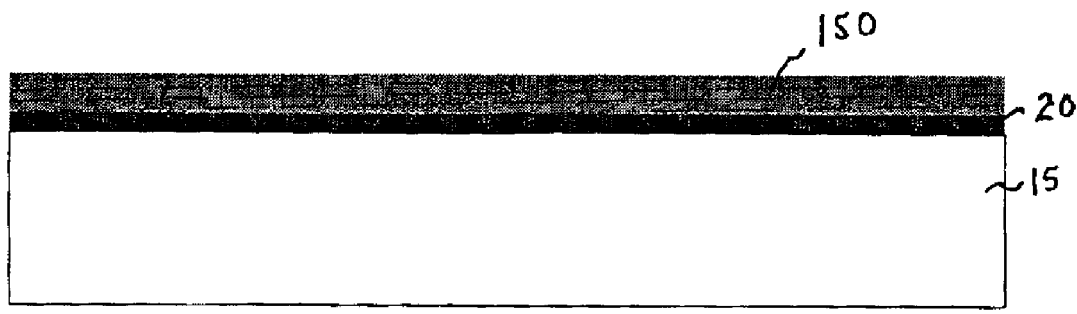
Figure 4D:
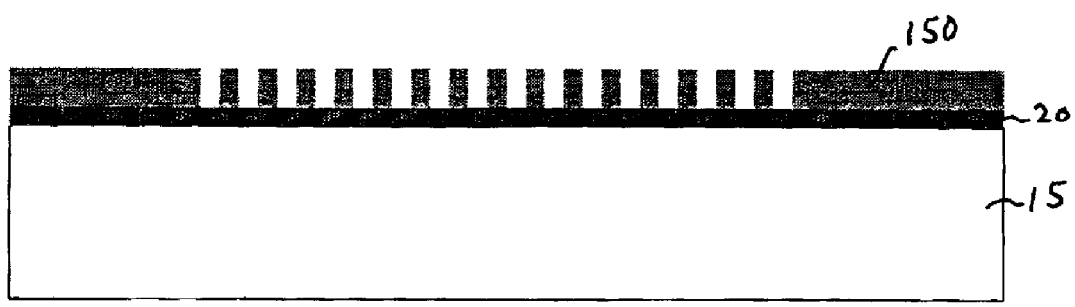
Figure 4E:
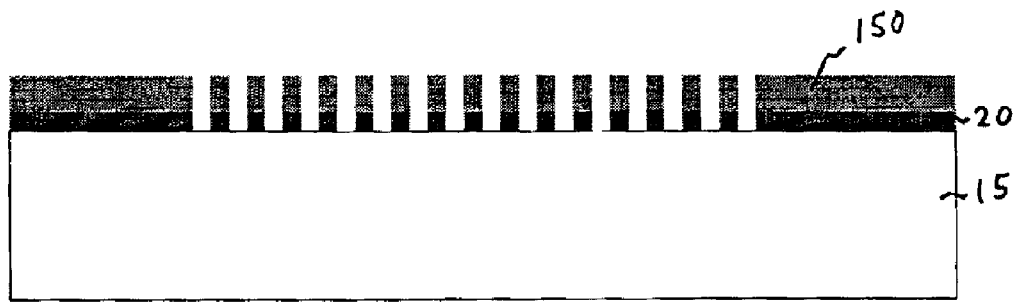
Figure 4F:
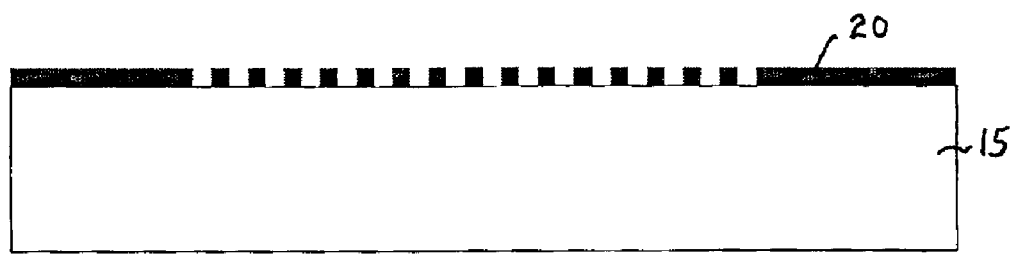

FIGS. 4A–4K show an exemplary process flow for fabricating the MEMS structure of FIG. 1 according to one embodiment. In FIG. 4A, a substrate 15 is provided. In FIG. 4B, a passivation layer 20 is deposited onto the substrate 15. In FIG. 4C a patterning layer 150, e.g., photoresist, is deposited onto the passivation layer 20. In FIG. 4D, the patterning layer 150 is patterned to have the desired pattern for the passivation layer 20. The pattern may be any one of the patterns shown in FIGS. 3A–3F or another pattern. The patterning layer 150 may be patterned using photolithography, selective laser etching, e-beam writing and the like. In FIG. 4E, the pattern of the patterning layer 150 is transferred to the passivation layer 20 by etching the passivation layer 25 with an etchant, e.g., KOH, that selectively etches away the portions of the passivation layer 20 exposed by the patterning layer 150. In FIG. 4F, the patterning layer 150 is removed, e.g., using acetone.

Alternatively, the passivation layer 20 may be patterned directly without the use of the patterning layer 150. For example, the passivation layer 20 may be made of a photo-imagable material, e.g., Benzocyclobutene (BSB), that can be patterned directly using UV light. In this example, the passivation layer 20 is patterned by exposing the passivation layer 20 to UV light through a photo mask (not shown) having the desired patterned and then selectively etching away portions of the passivation layer 20 exposed to the UV light, thereby transferring the pattern of the photo mask onto the passivation layer 20.

Figure 4G:
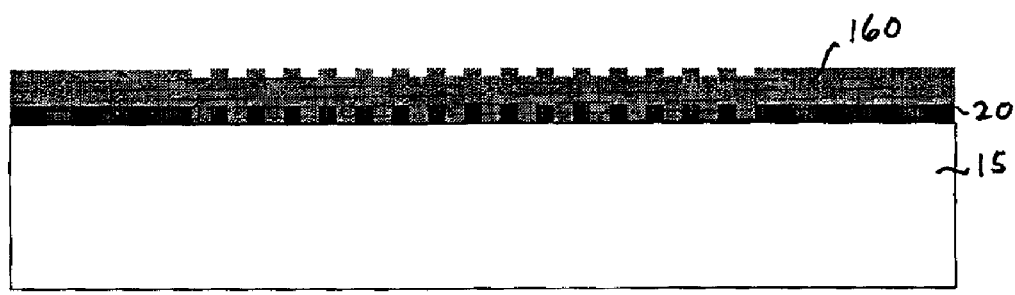
Figure 4H:
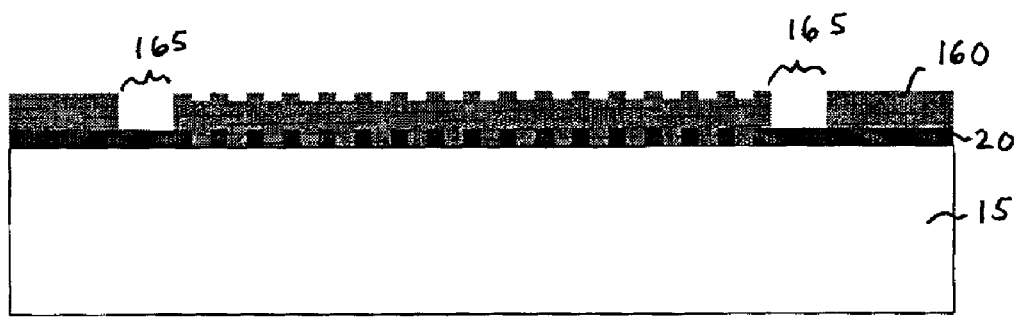
Figure 4I:
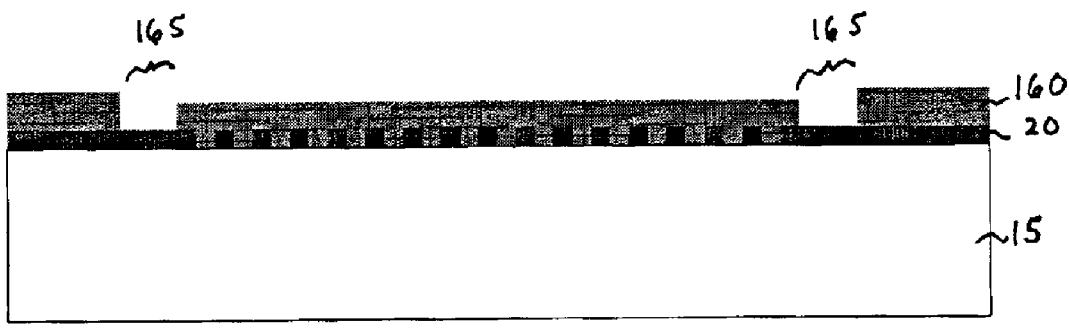
Figure 4J:
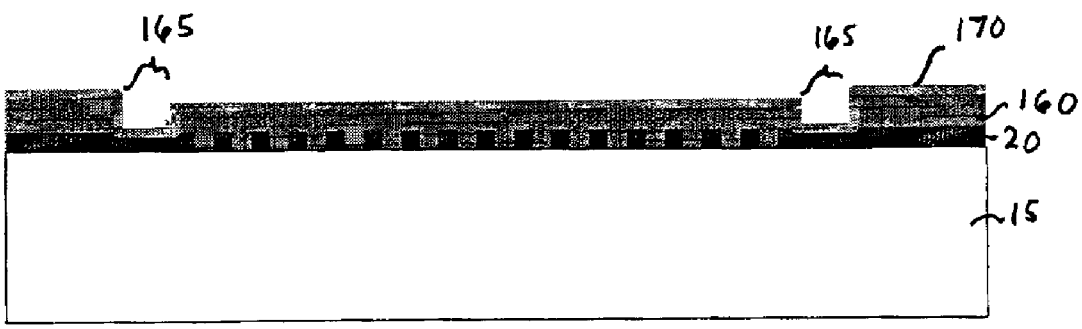
Figure 4K:
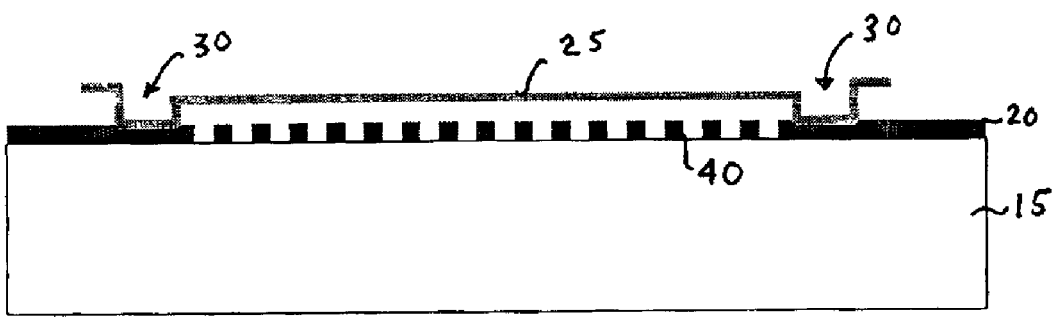

In FIG. 4G, a sacrificial layer 160 is deposited onto the patterned passivation layer 20. The sacrificial layer 160 is used to provide mechanical support for the beam 25 and the associated anchors 30 during fabrication. The sacrificial layer 160 may be any suitable material, e.g., a photoresist, a polyimide or an oxide. In FIG. 4H, the sacrificial layer 160 is patterned to form vias 165 in the sacrificial layer 160. At this stage in the process, the top surface of the sacrificial layer 160 may follow the contours of the patterned passivation layer 20, as illustrated in FIG. 4H. This is undesirable because the top surface of the sacrificial layer 160 will later define the bottom surface of the beam 25. In order to obtain a smoother bottom surface for the beam 25, the top surface of the sacrificial layer 160 is smoothed out by subjecting the sacrificial layer 160 to a hard bake at a sufficiently elevated temperature, e.g., at 200° C. The hard bake initially lowers the viscosity of the sacrificial layer 160, causing the top surface of the sacrificial layer 160 to re-flow and smooth out, as illustrated in FIG. 4I. The sacrificial layer 160 then hardens as moisture in the sacrificial layer 160 is evaporated. The re-flow process may also smooth the corners of the vias 165, which is not illustrated in FIG. 4I. In FIG. 4J, a metal or polysilicon layer 170 is deposited onto the sacrificial layer 160 and the vias 165. The metal layer 170 may be deposited using electroplating, sputtering, or e-beam deposition. In FIG. 4K, the metal layer 170 is patterned to form the beam 25 and the anchors 30, and the sacrificial layer 160 is removed to release the beam 25 above the substrate 15. The sacrificial layer 160 may be removed using suitable means, e.g., wet etching the sacrificial layer 160 followed by a rinse with a liquid agent, e.g. deionized (DI) water or methanol. The patterned passivation layer 20 alleviates stiction associated with the liquid agent, thereby increasing the production yield of the MEMS device.

Figure 5A:
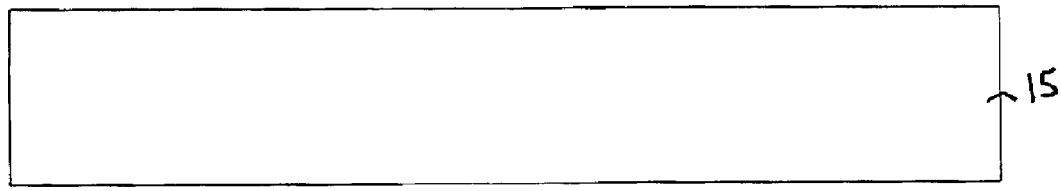
FIGS. 5A–5H show a process flow for fabricating the MEMS capacitor of FIG. 2 according to another embodiment of the invention.
Figure 5B:
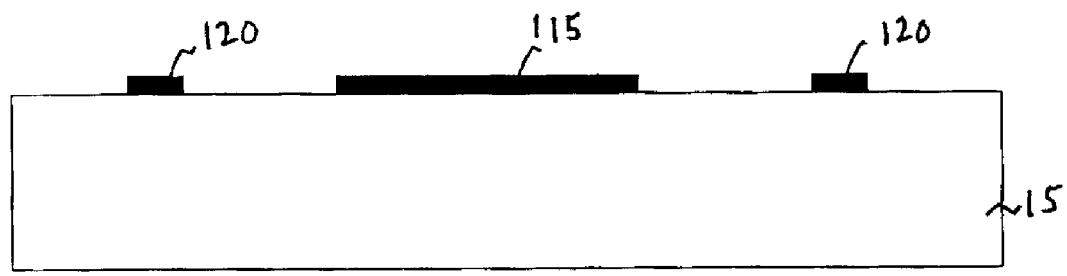
Figure 5C:
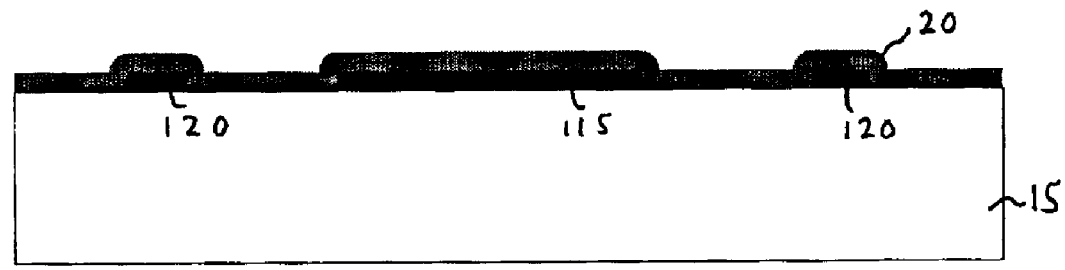
Figure 5D:
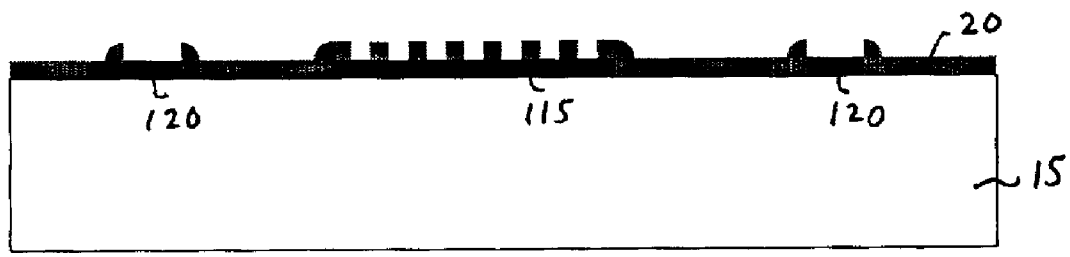
Figure 5E:
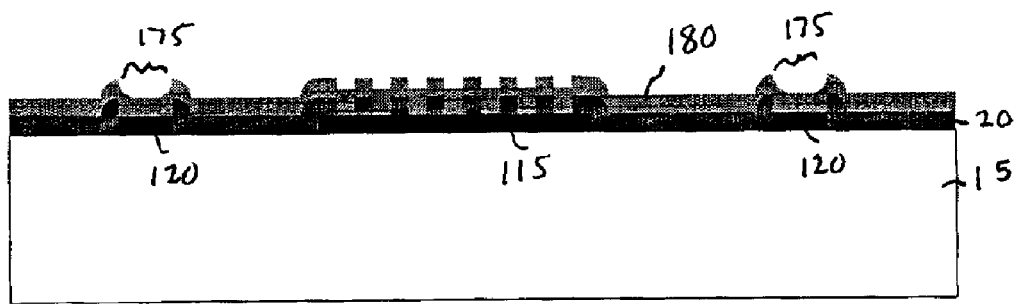
Figure 5F:
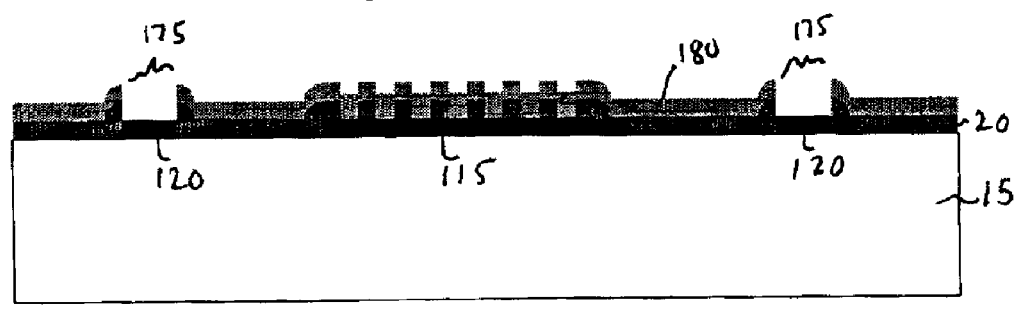
Figure 5G:
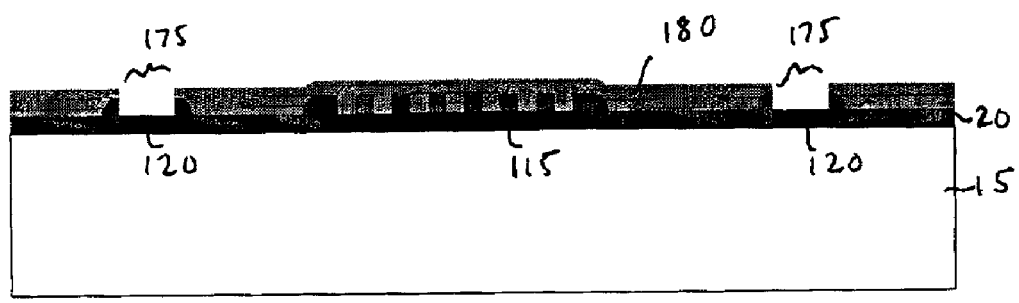
Figure 5H:
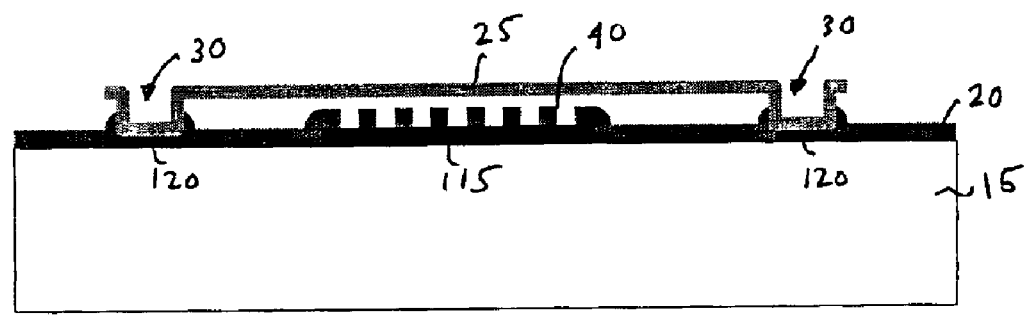

5A–5H show an exemplary process flow for fabricating the MEMS capacitor of FIG. 2. In FIG. 5A, a substrate 15 is provided. In FIG. 5B, a conductive material is deposited onto the substrate and patterned to form a bottom electrode 115 and two contact electrodes 120. In FIG. 5C, a passivation layer 20 is deposited onto the substrate 15. In FIG. 5D, the passivation layer 20 is patterned to form spaced protuberances 40 over the bottom electrode 115 and vias 175 above the contact electrodes 120. The passivation layer 20 may be patterned using a patterning layer (not shown) or may be patterned directly using a photo-imagable material for the passivation layer 20. In FIG. 5E, a sacrificial layer 180, e.g., photoresist, is deposited onto the passivation layer 20. In FIG. 5F, the portions of the sacrificial layer 180 corresponding to the vias 175 in the passivation layer 20 are etched away. In FIG. 5G, the sacrificial layer 180 is subjected to a hard bake to smooth out the top surface of the sacrificial layer 180. In FIG. 5H, a metal or polysilicon layer is deposited onto the sacrificial layer 180 and patterned to form the beam 25 and anchors 30 of the MEMS capacitor. In addition, the sacrificial layer 180 is removed to release the beam 25 above the substrate 15.

Figure 6:
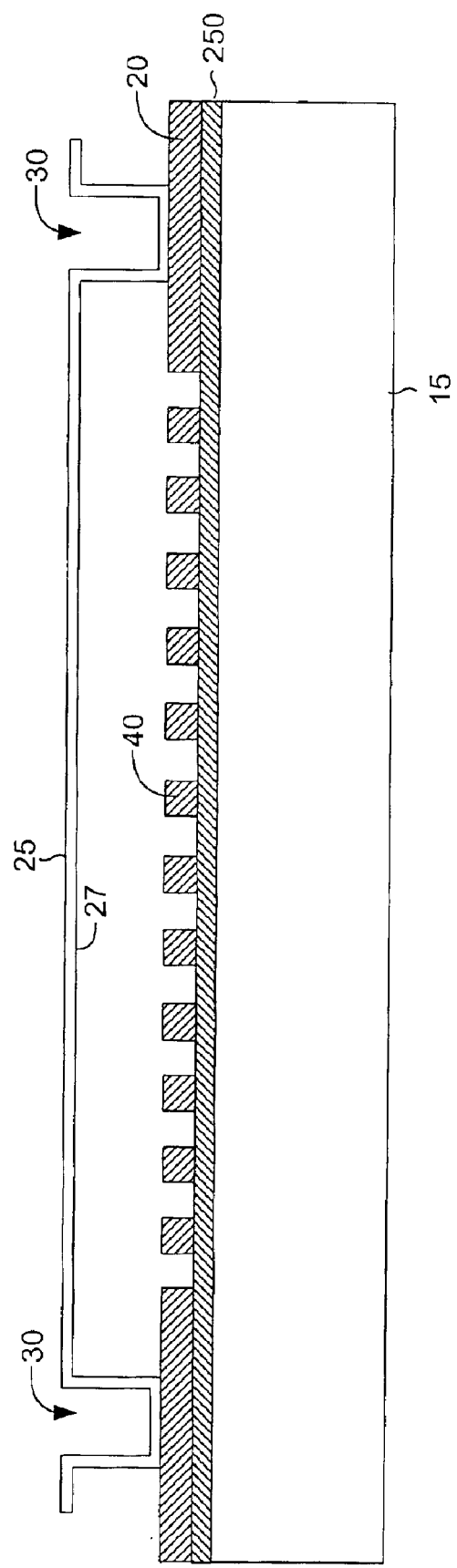
FIG. 6 shows a MEMS structure comprising a bottom dielectric layer underneath the patterned passivation layer according to an embodiment of the invention.

FIG. 6 shows a MEMS structure according to another embodiment. The MEMS structure is similar to the MEMS structure of FIG. 1, but further comprises a bottom dielectric layer 250 on the substrate 15 and underneath the patterned passivation layer 20. The MEMS structure according to this embodiment may be used to form a MEMS capacitor, e.g., by placing a bottom electrode (not shown) on the substrate 15. The dielectric layer 250 may be polyimide, silicon nitride or other oxide. The dielectric layer 250 may be deposited onto the substrate using standard MEMS fabrication methods. To prevent the dielectric layer 250 from being etched during patterning of the overlying passivation layer 20, the dielectric layer 250 may be solidified before deposition of the passivation layer 20. This may be done, e.g., by exposing the dielectric layer 250 to UV light followed by a hard bake.

While various embodiments of the application have been described, it will be apparent to those of ordinary skill in the art that many embodiments and implementations are possible that are within the scope of the present invention. For example, even though the patterned passivation layer was described in the context of alleviating stiction between a beam and a substrate, the patterned passivation layer may be used to alleviate stiction between any microstructure and a substrate or between two adjacent microstructures, e.g., by forming the patterned passivation on one of the two adjacent microstructures. Therefore, the invention is not to be restricted or limited except in accordance with the following claims and their equivalents.

What is claimed is:

1. A Micro-Electro-Mechanical capacitor, comprising:

a substrate, the substrate having an upper substantially planar surface;

a bottom plate, the bottom plate being electrically conductive and substantially planar and supported by the upper surface of the substrate, the plate being substantially continuous, a passivation layer disposed above the plate, the passivation layer having a top surface; and a microstructure suspended above the substrate, the plate and the passivation layer, the microstructure having a bottom surface facing the top surface of the passivation layer, the microstructure being moveable toward the passivation layer so as to approach the passivation layer;

wherein the passivation layer is patterned to form a plurality of spaced protuberances disposed on the plate.

2. The Micro-Electro-Mechanical capacitor of claim 1, wherein the bottom surface of the microstructure is substantially flat.

3. The Micro-Electro-Mechanical capacitor of claim 1, wherein at least one of the protuberances has a square cross section.

4. The Micro-Electro-Mechanical capacitor of claim 1, wherein at least one of the protuberances has a rectangular cross section.

5. The Micro-Electro-Mechanical capacitor of claim 1, wherein at least one of the protuberances has a hexagonal cross section.

6. The Micro-Electro-Mechanical capacitor of claim 1, wherein the passivation layer comprises polyimide.

7. The Micro-Electro-Mechanical capacitor of claim 1, wherein the passivation layer comprises silicon nitride.

8. The Micro-Electro-Mechanical capacitor of claim 1, wherein the passivation layer is made of a dielectric material selected from the group consisting of silicon oxide, strontium titanate oxide, barium strontium titanate, and benzocyclobutene.

9. A Micro-Electro-Mechanical capacitor, comprising:

a substrate; the substrate having an upper substantially planar surface, a bottom plate, the bottom plate being electrically conductive, the plate being substantially planar and supported by the upper surface of the substrate, the plate being substantially continuous, a passivation layer disposed above the plate, the passivation layer having a top surface;

a support attached to the substrate; and a beam attached at one end to the support and suspended above the substrate, the passivation layer and the plate, the beam having a bottom surface facing the of the passivation layer, the beam being moveable toward the passivation layer so as to approach passivation layer;

wherein the passivation layer is patterned to form a plurality of spaced protuberances disposed on the plate.

10. The Micro-Electro-Mechanical capacitor of claim 9, further comprising a second support attached to the substrate and wherein the beam is attached to the second support at a second end.

11. The Micro-Electro-Mechanical capacitor of claim 9, further comprising said bottom plate on the substrate and underneath the bottom surface of the beam.

12. The Micro-Electro-Mechanical capacitor of claim 9, wherein the bottom surface of the beam is substantially flat.

13. The Micro-Electro-Mechanical capacitor of claim 9, wherein at least one of the protuberances has a square cross section.

14. The Micro-Electro-Mechanical capacitor of claim 9, wherein at least one of the protuberances has a rectangular cross section.

15. The Micro-Electro-Mechanical capacitor of claim 9, wherein at least one of the protuberances has a hexagonal cross section.

16. The Micro-Electro-Mechanical capacitor of claim 9, wherein the passivation layer comprises polyimide.

17. The Micro-Electro-Mechanical capacitor of claim 9, wherein the passivation layer comprises silicon nitride.

18. The Micro-Electro-Mechanical capacitor of claim 9, wherein the passivation layer is made of a dielectric material selected from the group consisting of silicon oxide, strontium titanate oxide, barium strontium titanate, and benzocyclobutene.

* * * * *